United States Patent
Signoff et al.

(10) Patent No.: US 9,401,798 B1
(45) Date of Patent: Jul. 26, 2016

(54) FREQUENCY DOMAIN MULTIPLEXER

(71) Applicant: Marvell International Ltd., Hamilton (BM)

(72) Inventors: David M. Signoff, Santa Clara, CA (US); Alden Chee Ho Wong, Hayward, CA (US); Nuntha Kumar Krishnasamy Maniam, Cupertino, CA (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 127 days.

(21) Appl. No.: 14/332,341

(22) Filed: Jul. 15, 2014

Related U.S. Application Data

(60) Provisional application No. 61/846,575, filed on Jul. 15, 2013.

(51) Int. Cl.
*H04L 5/14* (2006.01)
*H04L 5/08* (2006.01)

(52) U.S. Cl.
CPC ........................................ *H04L 5/08* (2013.01)

(58) Field of Classification Search
None
See application file for complete search history.

(56) References Cited

U.S. PATENT DOCUMENTS 8,081,048 B2 * 12/2011 Okabe ................... H03H 7/463
333/126

OTHER PUBLICATIONS

Wu et al, Wi-Fi/WiMAX Dual Mode RF MMIC Front-end Module, IEEE, 4 pages, 2009.*
Kim et al, A Novel Integrated Tx-Rx Diplexer for Dual-band WiMAX System, IEEE, 4 pages, 2010.*
Gianesello et al, Integration of multi-standard Front End Modules SOCs on High Resitivity SOI RF CMOS Technogy, IEEE, 4 pages, 2010.*

* cited by examiner

*Primary Examiner* — Frank Duong

(57) ABSTRACT

An apparatus includes an antenna, a first transceiver circuit, a second transceiver circuit, a first filter coupled between the antenna and the first transceiver circuit and configured to pass a first signal and attenuate a second signal, and a second filter coupled between the antenna and the second transceiver circuit and configured to pass the second signal and attenuate the first signal. The first signal has a first frequency and the second signal has a second frequency. The first transceiver circuit, the second transceiver circuit, and the first filter are integrated in a system on chip (SOC).

20 Claims, 8 Drawing Sheets

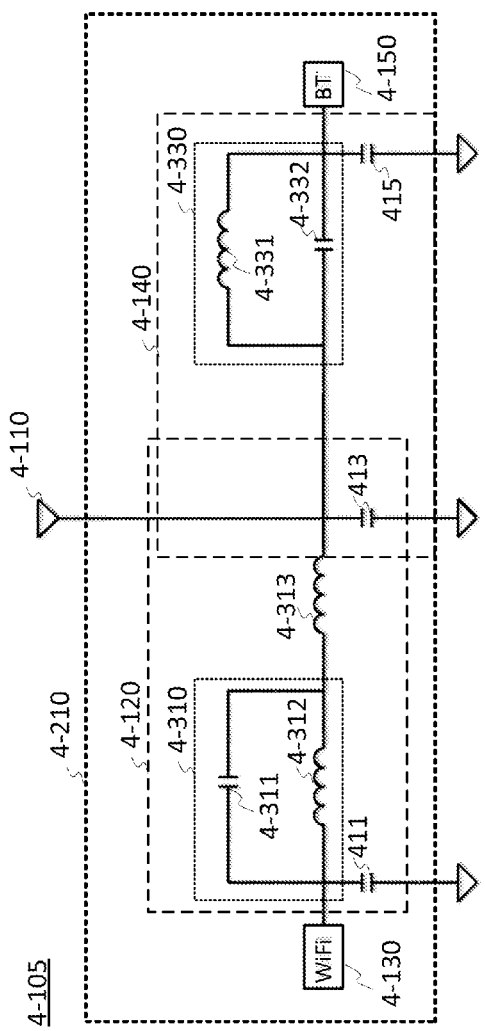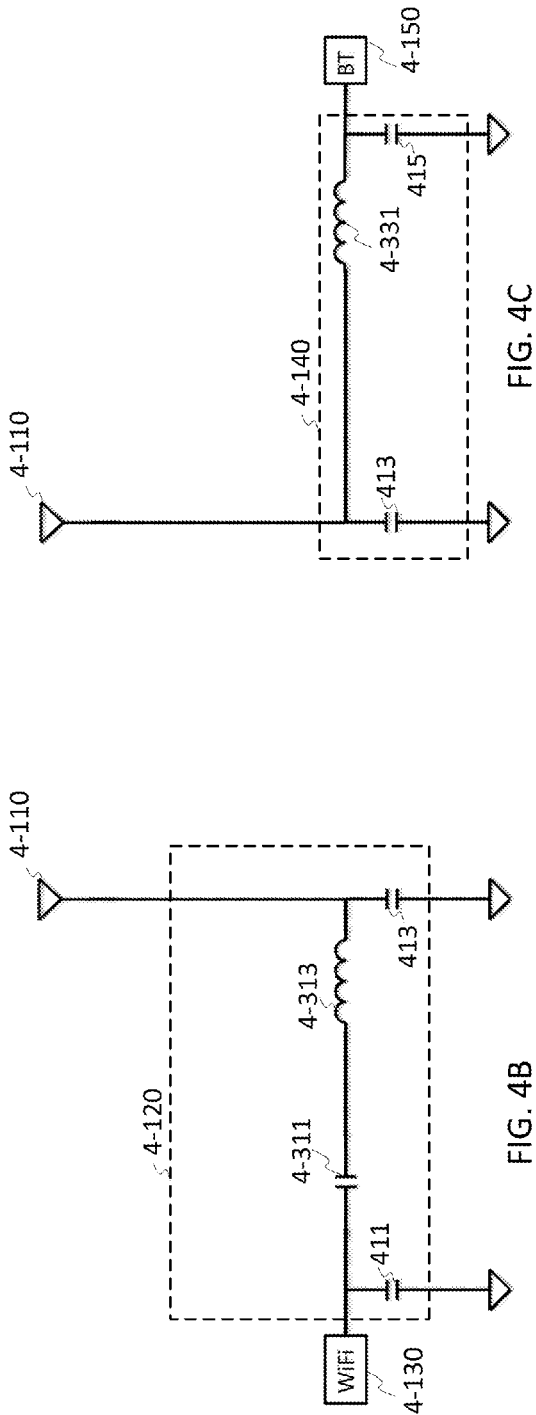

FREQUENCY DOMAIN MULTIPLEXER

CROSS-REFERENCE TO RELATED APPLICATION

This present disclosure claims the benefit of U.S. Provisional Application No. 61/846,575, entitled "ON CHIP DIPLEXER," filed on Jul. 15, 2013, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Integration of many functions on a single chip, including fabricating analog and digital circuitry on the same die, is desirable in many applications of semiconductor technology including RF communication devices. As a result, many different components of an RF communication device such as a power amplifier (PA), a low-noise amplifier (LNA), impedance matching components, and the like, have been integrated onto a system on chip (SOC). However, frequency domain multiplexers including diplexers, triplexers, and the like, remain as off-chip components in the RF device.

SUMMARY

In an embodiment, an apparatus includes an antenna, a first transceiver circuit, a second transceiver circuit, a first filter coupled between the antenna and the first transceiver circuit and configured to pass a first signal and attenuate a second signal, and a second filter coupled between the antenna and the second transceiver circuit and configured to pass the second signal and attenuate the first signal. The first signal has a first frequency and the second signal has a second frequency. The first transceiver circuit, the second transceiver circuit, and the first filter are integrated in a system on chip (SOC).

In an embodiment, the second filter is integrated in the SOC.

In an embodiment, the first filter includes a first parallel circuit having a first capacitor and a first inductor that are coupled to each other in parallel, and a second inductor coupled in series with the first parallel circuit.

In an embodiment, the first frequency is in a 5 GHz band for WiFi™ communication and the second frequency is in a 2.4 GHz band for Bluetooth® communication.

In an embodiment, a method includes passing a first signal and attenuating a second signal by a first filter coupled between an antenna and a first transceiver circuit, passing the second signal and attenuating the first signal by a second filter coupled between the antenna and a second transceiver circuit. The first signal has a first frequency and the second signal has a second frequency. The first transceiver circuit, the second transceiver circuit, and the first filter are integrated in an SOC.

In an embodiment, the first filter includes a parallel circuit that is configured to have a maximum impedance value at the second frequency in order to attenuate the second signal.

In an embodiment, the second filter is disposed outside the SOC, a package element is coupled to the first filter and the second filter, and a third filter is coupled to the second transceiver circuit and the package element. The method further includes attenuating a second harmonic of the second signal using the third filter to prevent a propagation of the second harmonic through the package element to a transmission path of the first signal.

In an embodiment, the first frequency is in a 5 GHz band for WiFi™ communication and the second frequency is in a 2.4 GHz band for Bluetooth® communication.

BRIEF DESCRIPTION OF THE DRAWINGS

Various embodiments of this disclosure that are proposed as examples will be described in detail with reference to the following figures, wherein like numerals reference like elements, and wherein:

FIG. 4A is a third circuit diagram of the portion of FIG. 2, according to an embodiment.

FIG. 4B illustrates elements of the portion 4-105 of FIG. 4A used to perform 5 GHz communication, according to an embodiment.

FIG. 4C illustrates elements of the portion 4-105 of FIG. 4A used to perform 2.4 GHz communication, according to an embodiment.

DETAILED DESCRIPTION OF EMBODIMENTS

Figure 1:
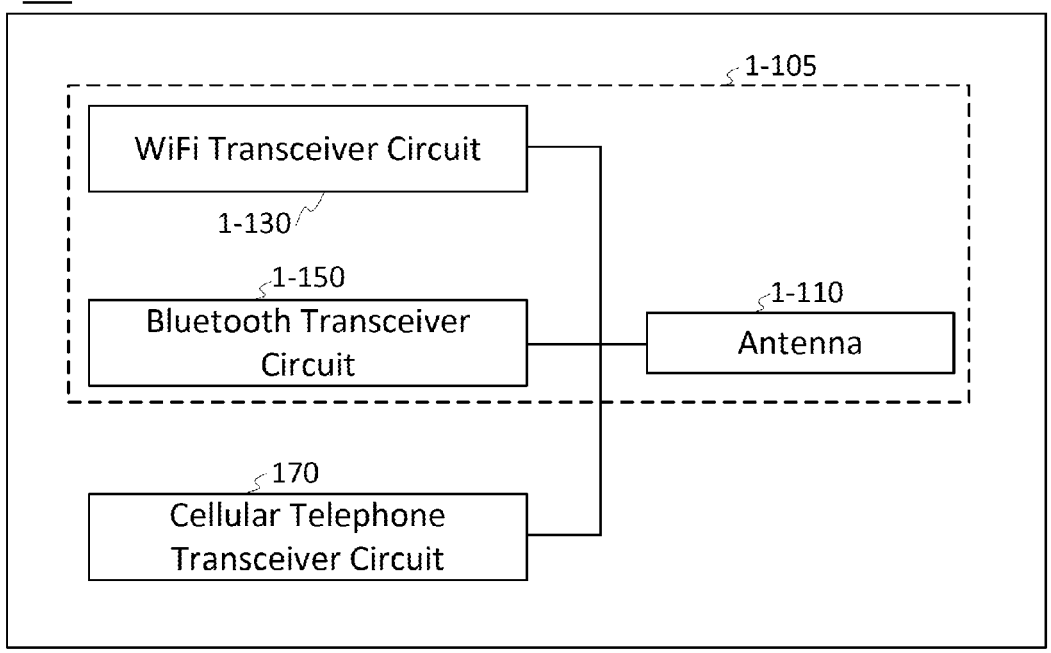
FIG. 1 is a block diagram of a wireless device including a plurality of transceiver circuits that operate in multiple communication bands according to an embodiment.

FIG. 1 is a block diagram of a wireless device 100 that communicates in multiple communication bands according to an embodiment. In this embodiment, the wireless device 100 includes a first transceiver circuit 1-130 that handles signals in 5 GHz band, for example, signals having frequencies between 4.9 GHz and 5.9 GHz, for WiFi™ communication, and a second transceiver circuit 1-150 that handles signals in 2.4 GHz band, for example, signals having frequencies between 2.4 and 2.5 GHz, for Bluetooth® communication.

The wireless device 100 also includes a third transceiver circuit 170 that handles signals in cellular telephone bands, for example, 850 MHz, 900 MHz, 1900 MHz, 2100 MHz bands, and the like. If desired, the wireless device 100 may also include any other suitable transceiver circuits.

In the wireless device 100, the first, second, and third transceiver circuits 1-130, 1-150, and 170 use a shared antenna 1-110 to transmit or receive signals. As a result, the size of the wireless device 100 may be reduced compared to using a separate antenna for each of the first, second, and third transceiver circuits 1-130, 1-150, and 170.

Figure 2:
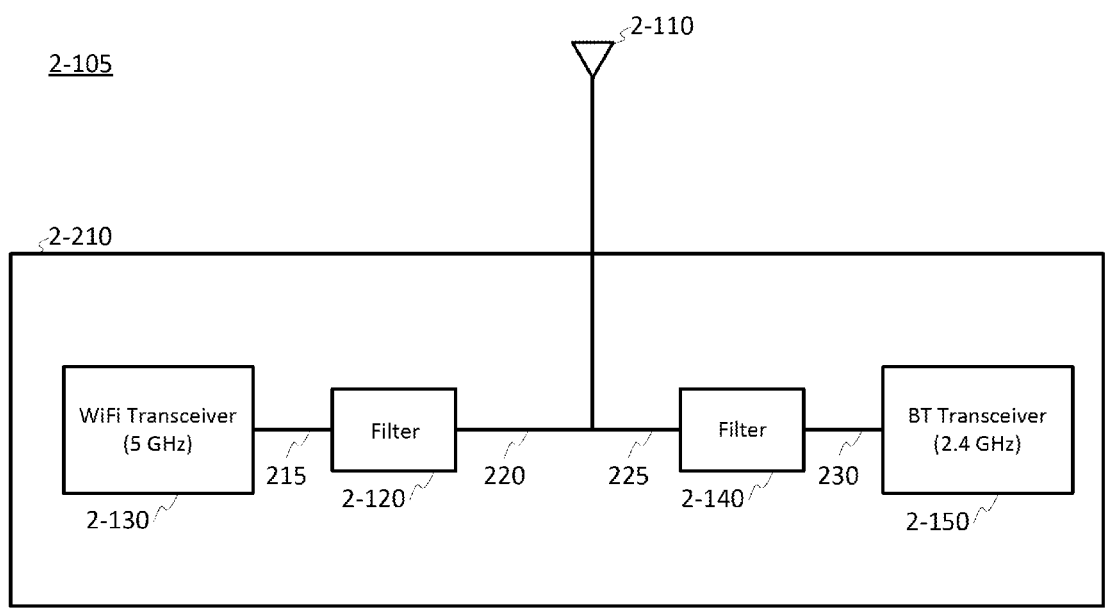
FIG. 2 is a block diagram of a portion of the wireless device of FIG. 1 including an SOC that has two transceiver circuits and two filters, according to an embodiment.

FIG. 2 is a block diagram of a portion of a wireless device 2-105, corresponding to the portion 1-105 of the wireless device 100 of FIG. 1, and including an System On a Chip (SOC) 2-210 and an antenna 2-110 according to an embodiment. The SOC 2-210 has first and second transceiver circuits 2-130 and 2-150, and first and second filters 2-120 and 2-140 configured to operate together as a diplexer, e.g., an on-chip diplexer.

In this embodiment, the first transceiver circuit 2-130 transmits and receives signals in a first frequency band, which in this embodiment includes 5 GHz band radio-frequency signals for WiFi communication. The second transceiver circuit 2-150 transmits and receives signals in a second frequency band different from the first frequency band, which in this embodiment includes 2.4 GHz band radio-frequency signals for Bluetooth communication. In an embodiment, the first and second frequency bands do not overlap.

The first and second transceiver circuits 2-130 and 2-150 share the same antenna 2-110 that is suitable for handling signals in both the first and second frequency bands. The first filter 2-120 couples the first transceiver circuit 2-130 to the antenna 2-110 and the second filter 2-140 couples the second transceiver circuit 2-150 to the antenna 2-110, in order to allow the first and second transceiver circuits 2-130 and 2-150 to share the antenna 2-110.

When the antenna 2-110 receives or transmits first signals in the first frequency band, the first filter 2-120 passes the first signals while the second filter 2-140 blocks the first signals. As a result, the first signals in the first frequency band are received or transmitted by the first transceiver 2-130, but are not received or are received at a highly-attenuated signal level by the second transceiver 2-150.

Similarly, when the antenna 2-110 receives or transmits second signals in the second frequency band, the second filter 2-140 passes the second signals while the first filter 2-120 blocks the second signals. As a result, the second signals in the second frequency band are received or transmitted by the second transceiver 2-150, but are not received or are received at a highly-attenuated signal level by the first transceiver 2-130.

In an embodiment wherein the first frequency band includes higher frequencies than the second frequency band, the first filter 2-120 includes high-pass filter or a band-pass filter that passes the frequencies in the first frequency band and blocks or substantially attenuates frequencies in the second frequency band. In such an embodiment, the second filter 2-140 may include a low-pass filter or a band-pass filter that passes the frequencies in second frequency band and blocks or substantially attenuates frequencies in the first frequency band.

In an embodiment, the first filter 2-120 includes a band stop filter that substantially attenuates signals in the second frequency band. The second filter 2-140 may include a band stop filter that substantially attenuates signals in the first frequency band. In an embodiment, each of the first and second filters 2-120 and 2-140 includes one or more of an appropriate band stop filter, band pass filter, high pass filter, and low pass filter. In an embodiment, each of the first and second filters 2-120 and 2-140 may include only passive filters, for example, filters comprising only passive components such as inductors, capacitors, resistors, and the like.

Figure 3A:
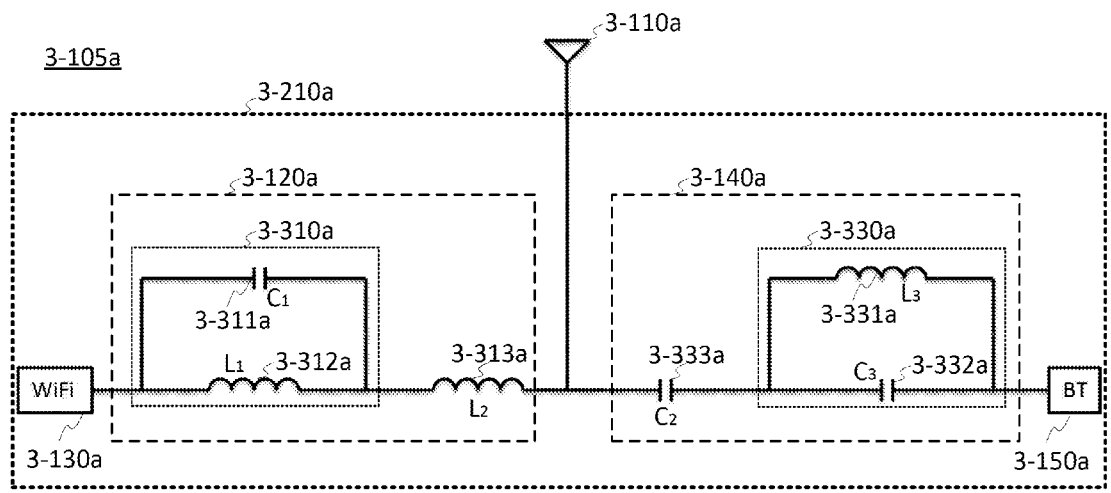
FIG. 3A is a first circuit diagram of the portion of FIG. 2, according to an embodiment.

FIG. 3A is a first circuit diagram of a portion 3-105a of a wireless device including an SOC 3-210a and an antenna 3-110a according to an embodiment. The SOC 3-210 has first and second transceiver circuits 3-130a and 3-150a, and first and second filters 3-120a and 3-140a.

The first filter 3-120a includes a first parallel LC circuit 3-310a that has a first inductor 3-312a and a first capacitor 3-311a, and a second inductor 3-313a coupled to the first parallel LC circuit 3-310a in series. Where $L_1$ denotes an inductance value measured in henries of the first inductor 3-312a and $C_1$ denotes a capacitance value measured in farads of the first capacitor 3-311a, a first resonant frequency $f_1$ measured in hertz of the first parallel LC circuit 3-310a is expressed as follows:

$$f_1 = \frac{1}{2\pi\sqrt{L_1 C_1}}. \qquad \text{Equation 1}$$

In this embodiment, the first parallel LC circuit 3-310a has the first resonant frequency $f_1$ that is substantially equal to a frequency in the 2.4 GHz band. At the first resonant frequency $f_1$, the total impedance of the first parallel LC circuit 3-310a has a maximum value, and therefore for a signal having the first resonant frequency $f_1$, a current flowing through the first parallel LC circuit 3-310a is minimized. As a result, the first filter 3-120a including the first parallel LC circuit 3-310a becomes substantially open and stops or highly attenuates 2.4 GHz band radio-frequency signals.

When 5 GHz band radio-frequency signals for WiFi communication are transmitted to the first parallel LC circuit 3-310a, an inductive reactance of the first inductor 3-312a increases and a capacitive reactance of the first capacitor 3-311a decreases with the increase in frequency. As a result, the first parallel LC circuit 3-310a presents a predominantly capacitive impedance, and thus the first filter 3-120a becomes equivalent to a series LC circuit including the first capacitor 3-311a and the second inductor 3-313a.

Where $L_2$ denotes an inductance value in henries of the second inductor 3-313a and $C_1$ denotes a capacitance value in farads of the first capacitor 3-311a, a second resonant frequency $f_2$ in hertz of the first filter 3-120a is expressed as follows:

$$f_2 = \frac{1}{2\pi\sqrt{L_2 C_1}}. \qquad \text{Equation 2}$$

In this embodiment, the first filter 3-120a acting as the series LC circuit has the second resonant frequency $f_2$ that is substantially equal to a frequency within the 5 GHz band.

At the second resonant frequency $f_2$, the a total impedance of the first filter 3-120a has a minimum value, and therefore for a signal having the second resonant frequency $f_2$ a current flowing through the first parallel LC circuit 3-310a is maximized. As a result, the first filter 3-120a becomes substantially a short and passes 5 GHz band signals with a minimum amount of attenuation. In an embodiment, a passband of the first filter 3-120a ranges from 4.9 GHz to 5.9 GHz. In an embodiment, a stopband of the first filter 3-120a ranges from 2.4 GHz to 2.5 GHz.

The second filter 3-140a includes a second parallel LC circuit 3-330a that has a third inductor 3-331a and a third capacitor 3-332a, and a second capacitor 3-333a coupled to the second parallel LC circuit 3-330a in series. Where $L_3$ denotes an inductance value in henries of the third inductor 3-331a and $C_3$ denotes a capacitance value in farads of the third capacitor 3-332a, a third resonant frequency $f_3$ in hertz of the second parallel LC circuit 3-330a is expressed as follows:

$$f_3 = \frac{1}{2\pi\sqrt{L_3 C_3}}. \quad \text{Equation 3}$$

In this embodiment, the second parallel LC circuit 3-330a has the third resonant frequency $f_3$ that is substantially equal to a frequency in the 5 GHz band. At the third resonant frequency $f_3$, since a total impedance of the second parallel LC circuit 3-330a has a maximum value, a current flowing through the second parallel LC circuit 3-330a is minimum. As a result, the second filter 3-140a including the second parallel LC circuit 3-330a becomes substantially open and stops or substantially attenuates 5 GHz band signals.

When 2.4 GHz band radio-frequency signals for Bluetooth communication are transmitted to the second parallel LC circuit 3-330a, an inductive reactance of the third inductor 3-331a decreases and a capacitive reactance of the third capacitor 3-332a increases with the decrease in frequency. As a result, the second parallel LC circuit 3-330a presents a predominantly inductive impedance, and thus the second filter 3-140a becomes equivalent to a series LC circuit including the second capacitor 3-333a and the third inductor 3-331a.

Where $L_3$ denotes a inductance value in henries of the third inductor 3-331a and $C_2$ denotes a capacitance value in farads of the second capacitor 3-332a, a fourth resonant frequency $f_4$ in hertz of the second filter 3-140a is expressed as follows:

$$f_4 = \frac{1}{2\pi\sqrt{L_3 C_2}}. \quad \text{Equation 4}$$

In this embodiment, the second filter 3-140a acting as the series LC circuit has the fourth resonant frequency $f_4$ that is substantially equal to a frequency in the 2.4 GHz band.

At the fourth resonant frequency $f_4$, since a total impedance of the second filter 3-140a has a minimum value, a current flowing through the second filter 3-140a is a maximum. As a result, the second filter 3-140a becomes substantially a short and passes 2.4 GHz signals with a minimum amount of attenuation. In an embodiment, a passband of the second filter 3-140a ranges from 2.4 GHz to 2.5 GHz.

A person of ordinary skill in the art in light of the teachings and disclosures herein would understand how to select values for $L_1, L_2, L_3, C_1, C_2$, and $C_3$ to produce a desired first through fourth resonant frequencies $f_1$ through $f_4$, and desired respective band widths associated therewith.

In the embodiment described above, the first filter 3-120a passes 5 GHz band signals for WiFi™ Communication and stops 2.4 GHz band signals for Bluetooth® communication, while the second filter 3-140a passes the 2.4 GHz band signals and stops the 5 GHz band signals. Thus, the first and second filters 3-120a and 3-140a allow the first and second transceivers 3-130a and 3-150a to share the same antenna 3-110a for both of 5 GHz band WiFi™ communication and 2.4 GHz band Bluetooth® communication.

In the embodiment described above, the first and second filters 3-120a and 3-140a are integrated into the SOC 3-210a. Such integration may lead to coupling issues between components of the filters 3-120a and 3-140a, for example, interference between the inductors 3-312a, 3-313a, and 3-331a, change in transfer functions of the filters 3-120a and 3-140a, and the like.

In order to address these coupling issues, in an embodiment, the first and second filters 3-120a and 3-140a may be spaced apart from each other at a predetermined distance. In some embodiments, a closed metal ring is disposed around at least one of the inductors 3-312a, 3-313a, and 3-331a. In some embodiments, at least one of inductors 3-312a, 3-313a, and 3-331a is an inductor having an upper loop and a lower loop connected together at the middle of the inductor so that current flowing in a clockwise direction in one loop flows in a counter-clockwise direction in the other loop.

Figure 3B:
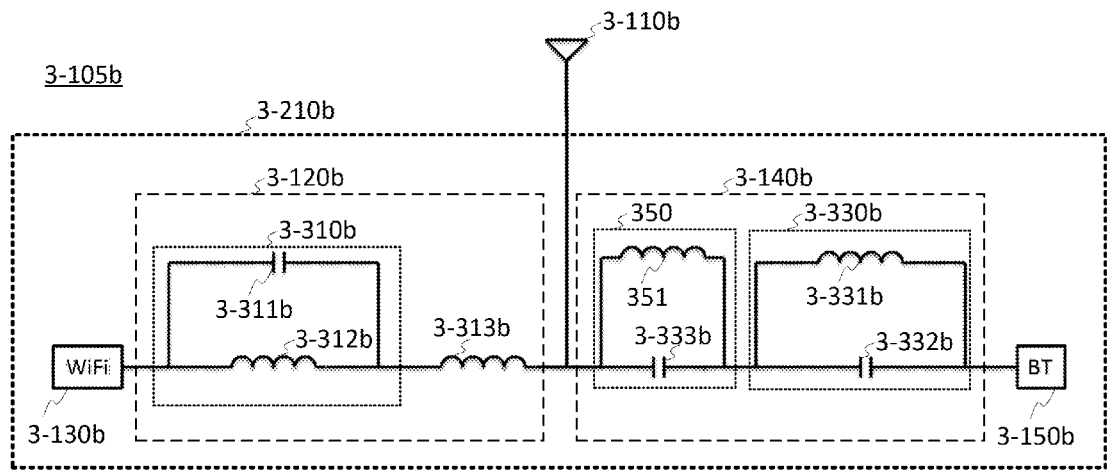
FIG. 3B is a second circuit diagram of the portion of FIG. 2, according to an embodiment.

FIG. 3B is a second circuit diagram of a portion 3-105b including an SOC 3-210b and an antenna 3-110b, according to an embodiment. Elements of the portion 3-105b correspond to similarly-numbered elements of the portion 3-105a of FIG. 3A.

The portion 3-105b differs from the portion 3-105a by addition of a fourth inductor 351. The fourth inductor 351 is coupled to a second capacitor 3-333b to provide an alternative path for protecting the second capacitor 3-333b from damage caused by electrostatic discharge (ESD).

In this embodiment, an inductance value of the fourth inductor 351 and a capacitance value of the second capacitor 3-333b is selected so that a second filter 3-140b including a second parallel LC circuit 3-330b and a third parallel LC circuit 350 operates in substantially the same manner as the second filter 3-140a of FIG. 3A. As a result, the second filter 3-140b passes 2.4 GHz radio-frequency signals and stops 5 GHz radio-frequency signals.

FIG. 4A is a third circuit diagram of a portion 4-105 including an SOC 4-210 and an antenna 4-110, according to an embodiment. Elements of the portion 4-105 having reference characters of the form "4-XXX" correspond to similarly-numbered elements of the portion 3-105a of FIG. 3A.

The portion 4-105 differs from the portion 3-105a by addition of a second capacitor 411, a third capacitor 413, and a fifth capacitor 415. The first capacitor 411 is coupled to a first terminal of a first parallel LC circuit 4-310 and a ground. The third capacitor 413 is coupled to a first terminal of a second parallel LC circuit 4-330, a second terminal of a second inductor 4-313, and the ground. The fifth capacitor 415 is coupled to a second terminal of the second parallel LC circuit 4-330 and the ground. These additional capacitors 411, 413, and 415 act as impedance matching elements between the antenna 4-110 and a load circuit (e.g., a first transceiver circuit 4-130 or a second transceiver circuit 4-150), as will be described below with reference to FIGS. 4B and 4C.

An additional difference of the portion 4-105 from the portion 3-105a is that the second parallel LC circuit 4-330 of a second filter 4-140 is connected to the antenna 4-110. Thus, in this embodiment, the second filter 4-140 does not include a capacitor corresponding to the second capacitor 3-333a of the second filter 3-140a.

FIG. 4B illustrates elements of the portion 4-105 of FIG. 4A that are used for 5 GHz band WiFi™ communication, according to an embodiment. When 5 GHz band radio-frequency signals are transmitted or received, the second parallel LC circuit 4-330 of FIG. 4A has the maximum impedance so that the second filter 4-140 stops or highly attenuates the 5 GHz signals. In addition, the first parallel LC circuit 4-310 of FIG. 4A presents a predominantly capacitive impedance to 5 GHz band signals. As a result, the elements shown in FIG. 4B including the first capacitor 4-311 and the second inductor 4-313 do not substantially attenuate the 5 GHz signals passing between the antenna 4-410 and the first transceiver circuit 4-130.

In this embodiment, the first filter 4-120 also acts as an impedance matching element between the antenna 4-110 and the first transceiver circuit 4-130. The first filter 4-120 including the second capacitor 411, the second inductor 4-313, and the third capacitor 413 forms a π (pi) matching network. In some embodiments, the first filter 4-120 forms different types of impedance matching networks such as an L network, a T network, and the like.

FIG. 4C illustrates active elements of the portion 4-105 of FIG. 4A during 2.4 GHz band Bluetooth® communication, according to an embodiment. When 2.4 GHz band radio-frequency signals are transmitted or received, the first parallel LC circuit 4-310 of FIG. 4A has the maximum impedance so that the first filter 4-120 stops or substantially attenuates the 2.4 band GHz signals. In addition, the second parallel LC circuit 4-330 of FIG. 4A presents a predominantly inductive impedance to 2.4 GHz signals. As a result, the elements shown in FIG. 4C including the third inductor 4-331 do not substantially attenuate the 2.4 band GHz signals passing between the antenna 4-410 and the first transceiver circuit 4-130.

In this embodiment, the second filter 4-140 also acts as an impedance matching element between the antenna 4-110 and the second transceiver circuit 4-150. The second filter 4-140 including the third capacitor 413, the third inductor 4-331, and the fifth capacitor 415 forms a π (pi) matching network.

As described above with reference to FIGS. 4A-4C, the first filter 4-120 and the second filter 4-140 allow the first transceiver 4-130 and the second transceiver 4-150 to share the antenna 4-110 for 5 GHz band (for example, WiFi™) and 2.4 GHz band (for example, Bluetooth®) communications, respectively. In addition, the first filter 4-120 and the second filter 4-140 act as an impedance matching element for 5 GHz band and 2.4 GHz band communications, respectively.

Figure 5:
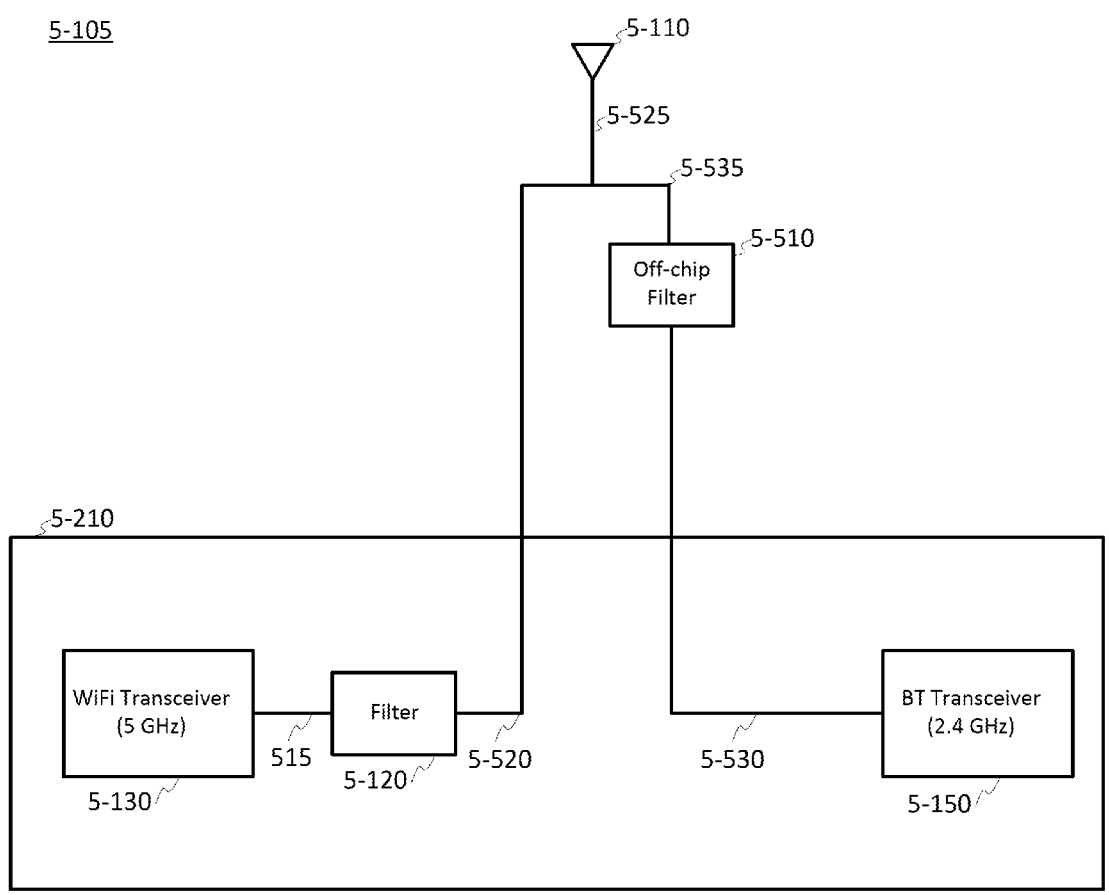
FIG. 5 is a block diagram of a portion of the wireless device of FIG. 1 including an off-chip filter and an SOC that has two transceiver circuits and a diplexer including one on-chip filter and one off-chip filter, according to an embodiment.

FIG. 5 is a block diagram of a portion 5-105 of the wireless device 100 of FIG. 1 including an SOC 5-210 and an off-chip filter 5-510 that is disposed outside the SOC 5-210, according to an embodiment. The SOC 5-210 includes a first transceiver circuit 5-130, a filter 5-120, and a second transceiver circuit 5-150.

In an embodiment, the second transceiver circuit 5-150 handles second radio-frequency signals having a narrower bandwidth than that of first radio-frequency signals handled by the first transceiver circuit 5-130. For example, in an embodiment where the first transceiver circuit 5-130 performs WiFi™ communications in the 5 GHz band and the second transceiver circuit 5-150 performs Bluetooth® communications in the 2.4 GHz band, the bandwidth of the first transceiver circuit 5-130 may be over 800 MHz, and the bandwidth of the second transceiver circuit 5-150 may be less than 100 MHz.

The off-chip filter 5-510 has a sufficiently narrow passband to pass the second radio-frequency signals having a bandwidth desired for the second transceiver circuit 5-150 while not passing signals outside the desired bandwidth. The off-chip filter 5-510 may include one or more of a surface acoustic wave (SAW) filter, a bulk acoustic wave (BAW) filter, a piezoelectric resonator, a microstrip ring resonator, and the like.

In an embodiment, the first transceiver circuit 5-130 uses a first frequency band that is near or adjacent to a second frequency band used by the second transceiver circuit 5-150. As a result, operation of the first transceiver circuit 5-130 may interfere with operation of the second transceiver circuit 5-150. In order to address coexistence issues including such interference, the off-chip filter 5-510 has a sufficiently narrow passband. In an embodiment, the off-chip filter 5-510 passes signals in the second frequency band without substantial attenuation, while attenuating signals in the first frequency band by at least 20 decibels (dB).

Figure 6A:
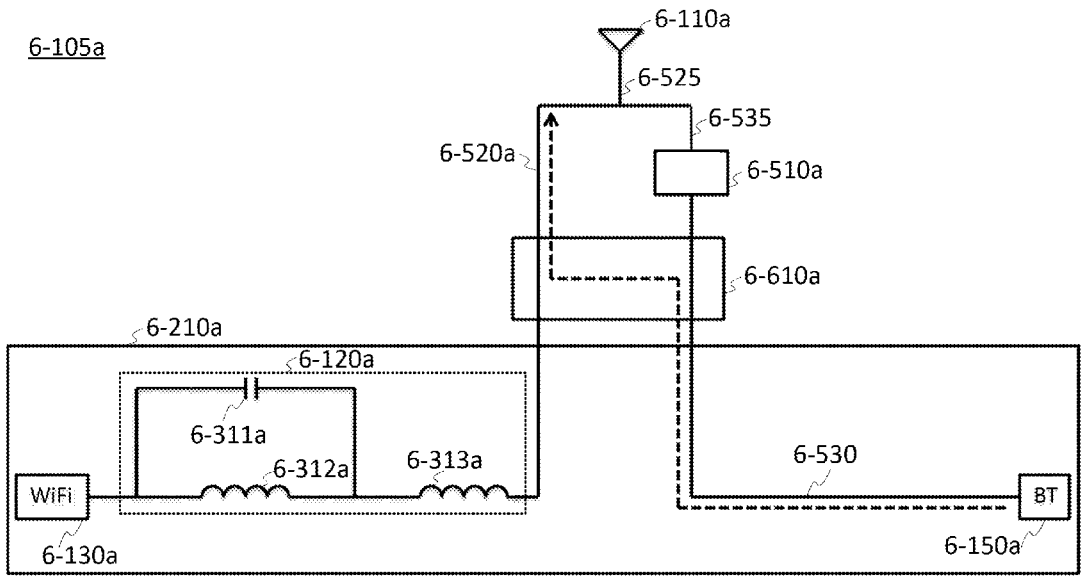
FIG. 6A illustrates propagation of a second harmonic of a second signal to a transmission path of a first signal through a package element in the portion of FIG. 5, according to an embodiment.

FIG. 6A illustrates a portion 6-105a including an SOC 6-210a, an off-chip filter 6-510a, and a package element 6-610a, according to an embodiment. FIG. 6A also illustrates propagation of a second harmonic of second radio-frequency signals handled by a second transceiver circuit 6-150a to a transmission path 6-520a of first radio-frequency signals handled by a first transceiver circuit 6-130a through the package element 6-610a. For example, the package element 6-610a may include a portion of one of a quad-flat no-leads (QFN) package, a dual-flat no-leads (DFN) package, a Chip Scale Package (CSP) flip-chip package, and the like.

In the embodiment of FIG. 6A, the first transceiver circuit 6-130a handles 5 GHz band radio-frequency signals for WiFi™ communication and the second transceiver circuit 6-150a handles 2.4 GHz band radio-frequency signals for Bluetooth® communication. The second transceiver circuit 6-150a may generate harmonics of the 2.4 GHz radio frequency signals. In particular, a second harmonic of the 2.4 GHz band radio frequency signals has a frequency (i.e., 2.4 to 2.48 GHz times 2=4.8-4.96 GHz) that is proximate to that of the 5 GHz band radio-frequency signals.

When the second harmonic of the 2.4 GHz band radio-frequency signals propagates through the package element 6-610a, the second harmonic may be superimposed on the 5 GHz band radio-frequency signals. Such superposition may result in interference between the second harmonic of the 2.4 GHz band signals and the 5 GHz band signals. Coupling issues including such interference are addressed in an embodiment shown in FIG. 6B, as will be described below in detail.

Figure 6B:
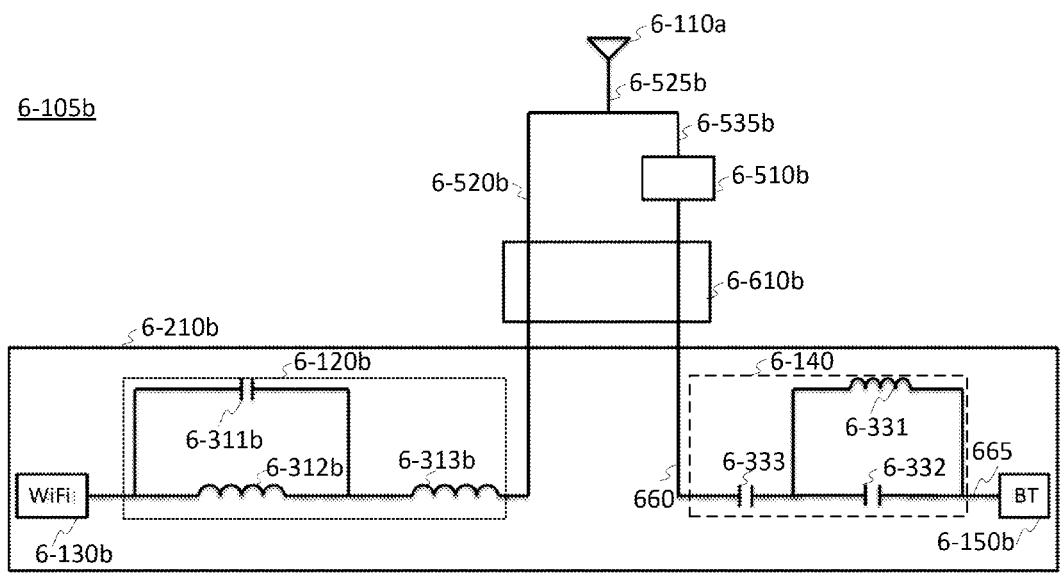
FIG. 6B is a circuit diagram of a system including an off-chip filter and an SOC that has two transceiver circuits and two on-chip filters, according to an embodiment.

FIG. 6B illustrates a portion 6-105b including an SOC 6-210b and an off-chip filter 6-510b according to an embodiment. Elements of the portion 6-105b correspond to similarly-numbered elements of the portion 6-105a of FIG. 6A.

The portion 6-105b differs from the portion 6-105a by addition of a second filter 6-140 in the SOC 6-210b. The second filter 6-140 includes a second capacitor 6-333, a third capacitor 6-332, and a third inductor 6-331, and operates in substantially the same manner as the second filter 3-140a of FIG. 3A.

The second filter 6-140 is configured to pass the 2.4 GHz band radio-frequency signals without significant attenuation and to stop or substantially attenuate other radio-frequency signals including the second harmonic of the 2.4 GHz band radio-frequency signals. Since the second harmonic of the 2.4 GHz band signals does not propagate to the transmission path 6-520b of the 5 GHz band radio-frequency signals through a transmission path 660 and the package element 6-610b, the above-described coupling issue may be addressed.

Figure 7:
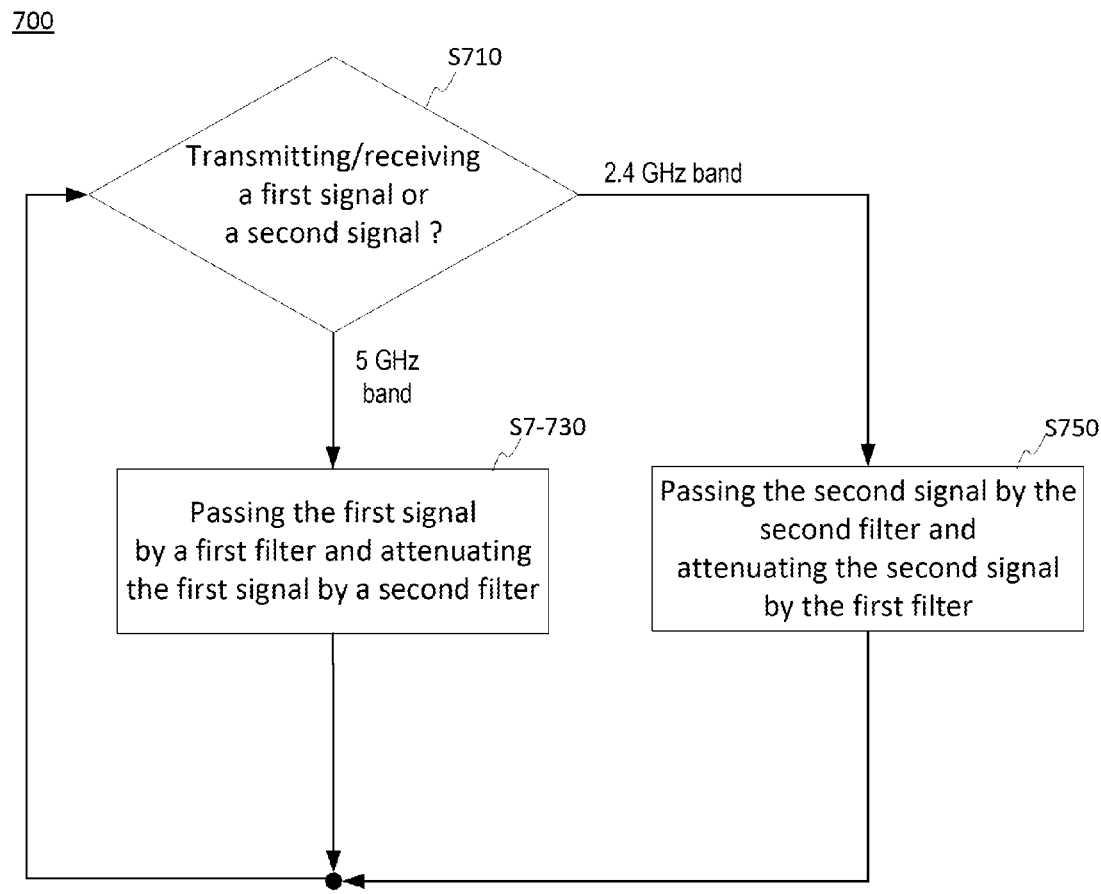
FIG. 7 is a flowchart of a method of sharing an antenna to transmit or receive signals having different frequencies according to an embodiment.

FIG. 7 is a flowchart 700 of a method of sharing an antenna to transmit or receive signals having different frequencies according to an embodiment. In an embodiment, a first signal having a first frequency in a 5 GHz frequency band and a second signal having a second frequency in a 2.4 GHZ frequency band are handled by a first transceiver for WiFi™ communication and a second transceiver for Bluetooth® communication, respectively.

At S710, a first signal or a second signal is transmitted or received by the shared antenna. When the first signal is transmitted or received, the method 700 proceeds to S7-730. When the second signal is transmitted or received, the method 700 proceeds to S750.

At S7-730, a first filter passes the first signal to transmit/receive the first signal to/from the first transceiver. On the other hand, a second filter attenuates the first signal to prevent the first signal being transmitted/received to/from the second transceiver.

At S750, the second filter passes the second signal to transmit/receive the second signal to/from the second transceiver. On the other hand, the first filter attenuates the second signal to prevent the second signal being transmitted/received to/from the first transceiver.

Figure 8A:
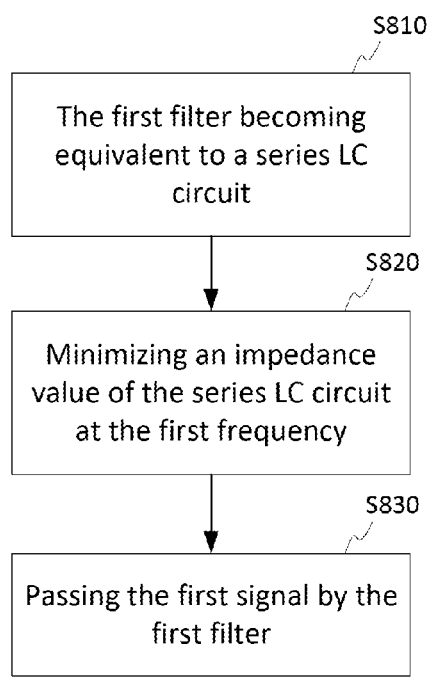
FIGS. 8A and 8B are flowcharts of a method of passing the first signal by the first filter of FIG. 7 and attenuating the first signal by the second filter of FIG. 7, according to an embodiment.
Figure 8B:
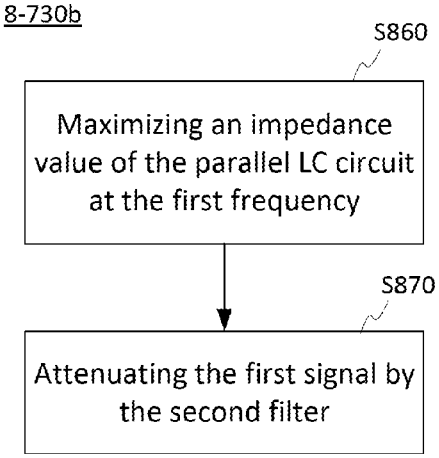

FIGS. 8A and 8B are flowcharts of a method 8-730 of operating a first filter and a second filter when a first signal having a first frequency is received/transmitted, according to an embodiment, such as may be used at S7-730 of the method 700 shown in FIG. 7. In an embodiment, the first filter includes a parallel LC circuit having a capacitor and a first inductor, and a second inductor coupled to the parallel LC circuit in series.

FIG. 8A is a flowchart 8-730a of a method of passing a first signal having a first frequency by a first filter. At S810, when the first signal having the first frequency is transmitted or received by the antenna, the parallel LC circuit of the first filter presents a predominantly capacitive impedance. As a result, the first filter in this embodiment becomes substantially equivalent to a series LC circuit including the first capacitor and the second inductor.

At S820, an impedance value of the series LC circuit at the first frequency is minimized. As a result, at S840, the first filter passes the first signal to or from the first transceiver circuit.

In an embodiment, a second filter is coupled to the antenna and a second transceiver circuit. For example, the second filter includes a parallel LC circuit having a first capacitor and an inductor, and a second capacitor coupled to the parallel LC circuit in series.

FIG. 8B is a flowchart 8-730b of a method of attenuating the first signal having the first frequency by a second filter. At S860, when the second signal having the second frequency is transmitted or received by the antenna, the parallel LC circuit of the second filter has the maximum impedance value at the first frequency. Thus, at S870, the second filter in this embodiment substantially attenuates the first signal to prevent the first signal being transmitted/received to/from the second transceiver circuit.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An apparatus comprising:
   an antenna;
   a first transceiver circuit;
   a second transceiver circuit;
   a first filter coupled between the antenna and the first transceiver circuit, and configured to pass a first signal and attenuate a second signal, the first signal having a first frequency and the second signal having a second frequency;
   a second filter coupled between the antenna and the second transceiver circuit, and configured to pass the second signal and attenuate the first signal, and
   wherein the first transceiver circuit, the second transceiver circuit, and the first filter are integrated in a system on chip (SOC), and
   wherein the first filter comprises a first parallel circuit including a first capacitor and a first inductor, the first capacitor and the first inductor being coupled to each other in parallel.

2. The apparatus of claim 1, wherein the second filter is integrated in the SOC.

3. The apparatus of claim 1, wherein the first filter further comprises
   a second inductor coupled in series with the first parallel circuit.

4. The apparatus of claim 3, wherein an impedance of the first parallel circuit has a maximum value at the second frequency.

5. The apparatus of claim 4, wherein the first filter becomes substantially equivalent to a series circuit including the first capacitor and the second inductor at the first frequency, and
   wherein an impedance value of the series circuit has a minimum value at the first frequency.

6. The apparatus of claim 5, wherein the first and second filters provide impedance matching between the antenna and the first and second transceivers, respectively.

7. The apparatus of claim 3, wherein the second filter comprises:
   a second parallel circuit including a second capacitor and a third inductor, the second capacitor and the third inductor coupled to each other in parallel; and
   a third capacitor coupled in series with the second parallel circuit.

8. The apparatus of claim 7, wherein an impedance of the second parallel circuit has a maximum value at the first frequency.

9. The apparatus of claim 8, wherein the second filter becomes substantially equivalent to a series circuit including the third inductor and the third capacitor at the second frequency, and
   wherein an impedance value of the series circuit has a minimum value at the second frequency.

10. The apparatus of claim 9, wherein the second filter further comprises a fourth inductor coupled to the third capacitor in parallel, the fourth inductor providing an alternative path for an electrostatic discharge (ESD) current.

11. The apparatus of claim 1, further comprising:
    a package element coupled to first and second transmission paths through which the first and second signals are transmitted, respectively; and
    a third filter coupled to the second filter and the package element, and being disposed outside the SOC,
    wherein the second filter attenuates a second harmonic of the second signal, the second harmonic being generated from the second transceiver circuit.

12. The apparatus of claim 1, wherein the first frequency is in a 5 GHz band for WiFi™ communication, and
    wherein the second frequency is in a 2.4 GHz band for Bluetooth® communication.

13. A method comprising:
    passing a first signal and attenuating a second signal by a first filter coupled between an antenna and a first transceiver circuit, the first signal having a first frequency and the second signal having a second frequency; and passing the second signal and attenuating the first signal by
a second filter coupled between the antenna and a second
transceiver circuit,
wherein the first transceiver circuit, the second transceiver
circuit, and the first filter are integrated in a system on
chip (SOC), and
wherein the first filter comprises a parallel circuit including
a first capacitor and a first inductor, the first capacitor
and the first inductor being coupled to each other in
parallel.

14. The method of claim 13, wherein the parallel circuit is configured to have a maximum impedance value at the second frequency in order to attenuate the second signal.

15. The method of claim 14, wherein the first filter becomes substantially equivalent to a series circuit that is configured to have a minimum impedance value at the first frequency to pass the first signal.

16. The method of claim 14, wherein the parallel circuit is a first parallel circuit, and
wherein the second filter includes a second parallel circuit that is configured to have a maximum impedance value at the first frequency in order to attenuate the first signal.

17. The method of claim 16, wherein the second filter becomes substantially equivalent to a series circuit that is configured to have a minimum impedance value at the second frequency to pass the second signal.

18. The method of claim 17, further comprising providing an alternative path for an electrostatic discharge (ESD) current using an inductor coupled to a capacitor in parallel.

19. The method of claim 13, wherein a package element is coupled to first and second transmission paths through which the first and second signals are transmitted, respectively,
wherein a third filter is coupled to the second filter and the package element, and is disposed outside the SOC, and
wherein the method further comprises attenuating a second harmonic of the second signal using the second filter to prevent a propagation of the second harmonic through the package element to the first transmission path of the first signal, the second harmonic being generated from the second transceiver circuit.

20. The method of claim 13, wherein the first frequency is in a 5 GHz band for WiFi™ communication, and
wherein the second frequency is in a 2.4 GHz band for Bluetooth® communication.

* * * * *